United States Patent
Yin et al.

(10) Patent No.: US 11,973,046 B2
(45) Date of Patent: *Apr. 30, 2024

(54) SEMICONDUCTOR STRUCTURE AND METHOD FOR PREPARING THE SAME

(71) Applicant: SJ Semiconductor(Jiangyin) Corporation, Jiangyin (CN)

(72) Inventors: Jiashan Yin, Jiangyin (CN); Zuyuan Zhou, Jiangyin (CN); Xingtao Xue, Jiangyin (CN); Chengchung Lin, Jiangyin (CN)

(73) Assignee: SJ Semiconductor (Jiangyin) Corporation, Jiangyin (CN)

( * ) Notice: Subject to any disclaimer, the term of this patent is extended or adjusted under 35 U.S.C. 154(b) by 235 days.

This patent is subject to a terminal disclaimer.

(21) Appl. No.: 17/465,449

(22) Filed: Sep. 2, 2021

(65) Prior Publication Data

US 2022/0077092 A1 Mar. 10, 2022

(30) Foreign Application Priority Data

Sep. 4, 2020 (CN) .......................... 202010921606.4
Sep. 4, 2020 (CN) .......................... 202021912435.0

(51) Int. Cl.
*H01L 21/3065* (2006.01)
*H01L 23/00* (2006.01)

(52) U.S. Cl.
CPC .......... *H01L 24/13* (2013.01); *H01L 21/3065* (2013.01); *H01L 24/11* (2013.01); *H01L 2224/11831* (2013.01); *H01L 2224/11845* (2013.01); *H01L 2224/13022* (2013.01); *H01L 2224/13147* (2013.01); *H01L 2224/1357* (2013.01); *H01L 2224/136* (2013.01)

(58) Field of Classification Search
CPC ..... H01L 24/13; H01L 21/3065; H01L 24/11; H01L 2224/11831; H01L 2224/11845; H01L 2224/13022; H01L 2224/13147; H01L 2224/1357; H01L 2224/136

See application file for complete search history.

(56) References Cited

U.S. PATENT DOCUMENTS

| | | | | |
|---|---|---|---|---|
| 5,674,787 | A * | 10/1997 | Zhao | H01L 21/76874 438/629 |
| 6,632,292 | B1 * | 10/2003 | Aegerter | H01L 21/6708 134/28 |
| 2014/0159239 | A1 * | 6/2014 | Bossler | H01L 21/30604 438/694 |
| 2016/0233155 | A1 * | 8/2016 | Lee | H01L 21/76898 |

* cited by examiner

*Primary Examiner* — Mohammad M Choudhry
(74) *Attorney, Agent, or Firm* — IPRTOP LLC

(57) ABSTRACT

The present disclosure provides a semiconductor structure and a method for preparing it. After planarization of the Cu layer, by means of wet etch process, Cu residues near an edge of a Cu post can be effectively removed, and a first height difference is configured to be between the Cu post and an insulating layer. Further, an Si substrate is then dry etched, so that a second height difference is configured to be between the Si substrate and the insulating layer, and the second height difference is arranged to be greater than the first height difference. In this way, a connection of Cu inside and outside the insulating layer may be further avoided, thereby effectively avoiding an influence on electrical properties of a device.

10 Claims, 2 Drawing Sheets

SEMICONDUCTOR STRUCTURE AND METHOD FOR PREPARING THE SAME

CROSS REFERENCE TO RELATED APPLICATION

The present application claims the benefit of priority to Chinese Patent Application No. CN 2020109216064, entitled "SEMICONDUCTOR STRUCTURE AND METHOD FOR PREPARING THE SAME", and Chinese Patent Application No. CN 2020219124350, entitled "SEMICONDUCTOR STRUCTURE", both filed with CNIPA on Sep. 4, 2020, the disclosure of which are incorporated herein by reference in its entirety for all purposes.

FIELD OF TECHNOLOGY

The present disclosure generally relates to the field of semiconductor manufacturing, and in particular, to a semiconductor structure and a method for preparing the same.

BACKGROUND

With the increasing functionality, performance and integration level of integrated circuits, packaging technology has been playing an increasingly important role in making integrated circuit products. Accounting for an increasing proportion of the values of the overall electronic systems. Wafer-level packaging (WLP) technology has become an important packaging method for demanding mobile/wireless network and other electronic devices, and has been ranked as one of the most promising packaging technologies due to its advantages of easy miniaturization, low cost, high integration level, and better performance at higher energy efficiency.

Redistribution layers (RDLs) in the package can rearrange the layout of chips' pads, so that the new layout may be designed in an array. Therefore, the RDLs are widely applied in the WLP technology. With the development of packaging technology, RDL metal wires layer having high densities and small spacings are critical. In the related arts, copper (Cu) is widely used in the WLP technology as a conductive material. However, since Cu is malleable, its residues often remain after a post Cu planarization process, such Cu traces have a detrimental influence on electrical properties of the prepared device having a high density and small spacings.

Therefore, it is necessary to provide a semiconductor structure and a method completely removing the Cu residues in preparing the device.

SUMMARY

The present disclosure provides a method for preparing a semiconductor structure, the method including:
providing a silicon (Si) substrate;
patterning the Si substrate to form a groove; forming an insulating layer in the groove to cover a bottom and side walls of the groove;
forming a Cu post to fill the groove;
performing planarization to expose the Si substrate, the insulating layer, and the Cu post;
performing a wet etch process to remove Cu residues and a part of the Cu post, so as to form a first height difference between the Cu post and the insulating layer; and
dry etching the Si substrate to form a second height difference between the Si substrate and the insulating layer, the second height difference is arranged to be greater than the first height difference.

Optionally, an etchant solution used during the wet etch process includes an acid solution facilitating a chemical reaction with Cu, and the acid solution includes one or a mixture of an $H_2O_2$ solution, an $H_3PO_4$ solution, and an $H_2SO_4$ solution.

Optionally, the first height difference is in a range of 0.1 µm to 0.5 µm, and the second height difference is in a range of 2 µm to 5 µm.

Optionally, the planarization includes one or more of mechanical polishing method and chemical mechanical polishing method.

Optionally, after the forming an insulating layer and before the forming a Cu post, the method further includes a step of forming a metal seed layer.

The present disclosure further provides a semiconductor structure, including: an Si substrate, an insulating layer, and a Cu post, wherein the Cu post is located in the Si substrate, the insulating layer covers side walls and a bottom surface of the Cu post and is in contact with the Si substrate, a first height difference is configured to be between the Cu post and the insulating layer, a second height difference is configured to be between the Si substrate and the insulating layer, and the second height difference is arranged to be greater than the first height difference.

Optionally, the first height difference is in a range of 0.1 µm to 0.5 µm.

Optionally, the second height difference is in a range of 2 µm to 5 µm.

Optionally, a metal seed layer is further formed between the insulating layer and the Cu post, and the metal seed layer has the same height as the Cu post.

Optionally, the insulating layer includes one or more of a $SiO_2$ layer and a $Si_3N_4$ layer.

As described above, according to the semiconductor structure and the method for preparing the same of the present disclosure, after planarization of the Cu layer, by means of wet etch process, Cu residues near an edge of a Cu post can be effectively removed, and a first height difference is configured to be between the Cu post and an insulating layer. Further, a Si substrate is dry etched, so that a second height difference is configured to be between the Si substrate and the insulating layer, and the second height difference is greater than the first height difference. In this way, connections between Cu materials inside and outside the insulating layer may be further avoided, thereby effectively avoiding contamination on electrical properties of the device.

Figure 1:
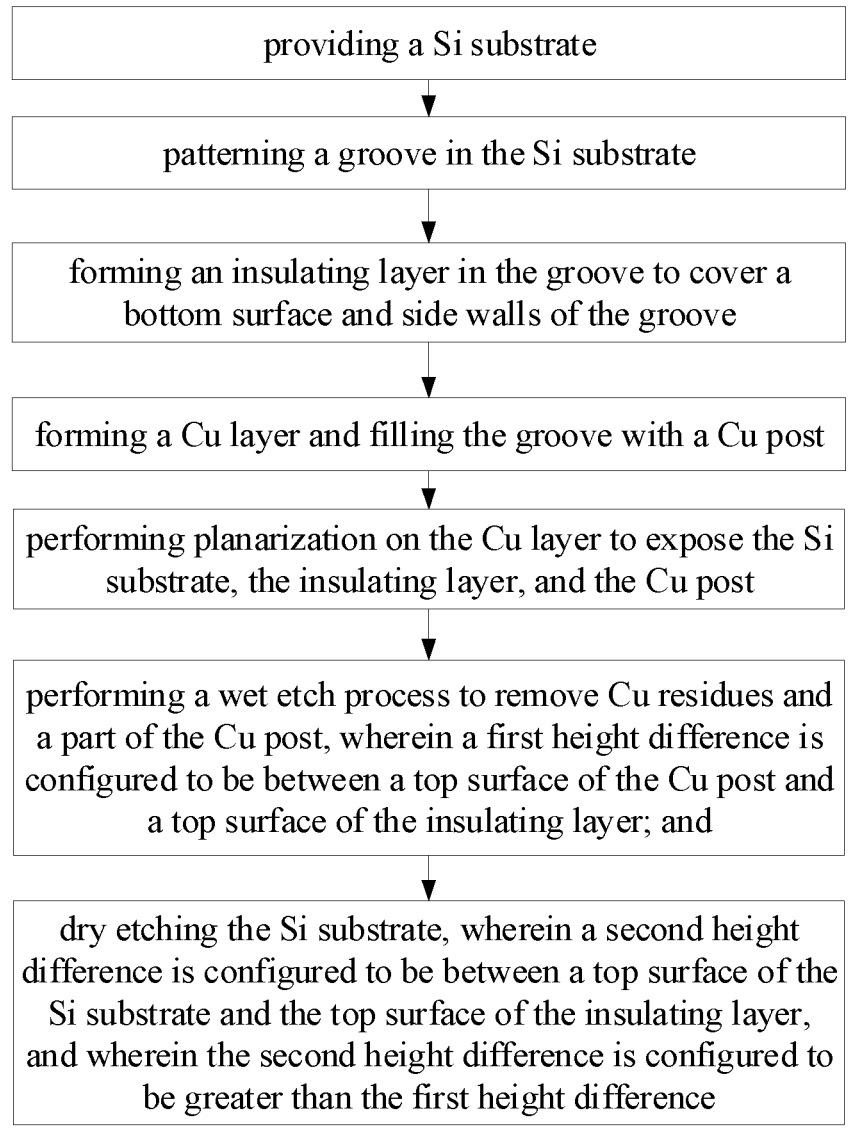
FIG. 1 is a process flow chart for preparing a semiconductor structure according to an embodiment.
Figure 2:
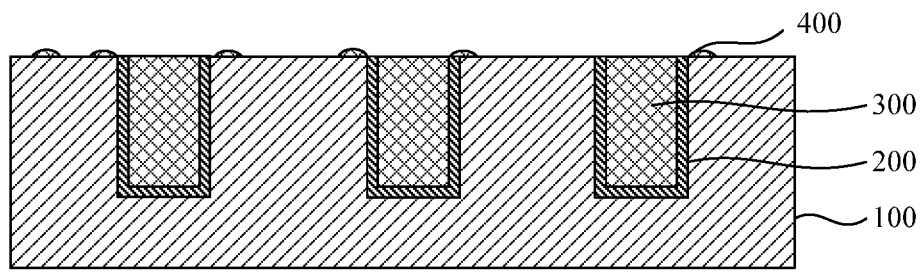
FIG. 2 is a schematic structural diagram after planarization of the Cu layer, according to an embodiment.

Reference Numerals
100 Si Substrate
200 Insulating layer
300 Cu post
400 Cu residue
D1 First height difference
D2 Second height difference

DETAILED DESCRIPTION

The implementations of the present disclosure are described below through specific examples. A person skilled in the art can easily understand other advantages and effects of the present disclosure from the content disclosed in this specification. The present disclosure may also be implemented or applied through other different specific implementations. Various details in this specification may also be modified or changed based on different viewpoints and applications without departing from the spirit of the present disclosure.

For example, when describing the embodiments of the present disclosure in detail, for ease of description, cross-sectional views for showing device structures are partially enlarged not necessarily to scale and the schematic diagrams are merely exampled and are not intended to limit the scope of the present disclosure. In addition, three-dimensional dimensions including length, width, and depth should be included during actual fabrication.

For ease of description, spatial terms, such as "under", "below", "lower", "beneath", "above", "upper", and the like, may be used herein to describe the relationship between one element or feature and another element or feature as shown in the accompanying drawings. It is to be understood that these spatial terms are intended to encompass other directions of the device in use or operation than the directions depicted in the accompanying drawings. In addition, when a layer is referred to as being "between" two layers, the layer may be the only layer between the two layers, or one or more layers may be present therebetween. As used herein, "between . . . and . . . " means that two endpoint values are included.

In the context of this application, a structure in which a first feature is described as being "on" a second feature may include an embodiment in which the first feature and the second feature are in direct contact with each other, or may include an embodiment in which there is another feature formed between the first feature and the second feature. In other words, the first feature and the second feature may not be in direct contact with each other.

It is to be noted that, the drawings provided in this embodiment are merely used as examples to describe the basic conception of the present disclosure. Therefore, only assemblies related to the present disclosure are shown in the drawings, but are not drawn based on a quantity, shapes, and sizes of assemblies during actual implementation. Patterns, quantities, and ratios of the assemblies during the actual implementation may vary, and a layout of the assemblies may be more complicated.

Referring to FIG. 1 to FIG. 4, the present disclosure provides a method for preparing a semiconductor structure, including the following steps:

providing an Si substrate 100;

patterning the Si substrate 100 to form a groove (not shown in the figure);

forming an insulating layer 200 in the groove to cover a bottom and side walls of the groove;

forming a Cu post 300 to fill the groove;

performing planarization to expose the Si substrate 100, the insulating layer 200, and the Cu post 300;

performing wet processing to remove Cu residues 400 and a part of the Cu post 300, so as to form a first height difference D1 between the Cu post 300 and the insulating layer 200; and dry etching the Si substrate 100, so as to form a second height difference D2 between the Si substrate 100 and the insulating layer 200, the second height difference D2 being greater than the first height difference D1.

In the method for preparing a semiconductor structure, after planarization of the Cu layer, by means of wet processing, the Cu residues 400 may be removed, and the first height difference D1 is configured to be between the Cu post 300 and the insulating layer 200. Further, by means of dry etching, a part of the Si substrate 100 may be removed to form the second height difference D2 between the Si substrate 100 and the insulating layer 200, and the second height difference D2 is configured to be greater than the first height difference D1. In this way, connections of Cu materials outside the insulating layer 200 may be further avoided, thereby effectively avoiding impact on electrical properties of the device.

Referring to FIG. 1, the Si substrate is first provided and patterned to form a groove.

Specifically, the method of patterning the Si substrate 100 may include a conventional photolithography method. For example, the patterning is performed by using a mask, and the lithography may include a photoresist, but the present disclosure is not limited thereto. The depth, width, and layout of the groove may be selected as required, and are not excessively limited herein.

Then, the insulating layer 200 is formed in the groove to cover the bottom and the side walls of the groove.

As an example, the insulating layer 200 includes one or more of a $SiO_2$ layer and a $Si_3N_4$ layer. By means of the insulating layer 200 covering the bottom and side walls of the groove, electrically conductive channels may be effectively prevented from being formed between a Cu post 300 that is subsequently formed and the Si substrate 100, thereby achieving a desirable insulation effect. The specific formation method, thickness, and material of the insulating layer 200 may be selected as required, and are not limited herein. In this embodiment, the insulating layer 200 is a $SiO_2$ layer, but the present disclosure is not limited thereto. The insulating layer 200 may be a $Si_3N_4$ layer or stacked layers comprising a $SiO_2$ layer and $Si_3N_4$ layer.

As an example, after the forming an insulating layer 200 and before the forming a Cu post 300, the method further includes forming a metal seed layer (not shown in the figures).

Specifically, the metal seed layer may be formed on the surface of the insulating layer 200 by using a PVD method, the seed layer may be a Ti/Cu seed layer or a Cu seed layer, but the present disclosure is not limited thereto. Preferably, the metal seed layer adopts the Cu seed layer, so that the metal seed layer has the same etching rate and height as the Cu post 300 during subsequent formation of the first height difference D1, thereby preventing the metal seed layer from being connected to Cu materials outside the insulating layer 200.

Then, the Cu post 300 is formed to fill the groove.

Specifically, when the metal seed layer is formed in the groove, the Cu post 300 may be formed by using an electroplating method, but the present disclosure is not limited thereto. For example, the Cu post 300 may also be prepared by using a patterned mask and a deposition method.

Then, the planarization is performed to expose the Si substrate 100, the insulating layer 200, and the Cu post 300.

As an example, the planarization includes one or more of mechanical polishing and chemical mechanical polishing.

Specifically, in an embodiment, a relatively flat surface may be obtained by means of mechanical polishing techniques and will be further refined by chemical mechanical polishing techniques. However, the planarization process is not limited thereto. For example, in some embodiments, only mechanical polishing is applied; in some other embodiments, only chemical mechanical polishing is applied as required. However, since Cu has excellent malleability, Cu residues 400 may be formed near an edge of the Cu post 300 during the planarization, and some contamination of Cu residues may have a detrimental impact on electrical properties of the subsequently prepared device especially for those having a high density and small spacings. Therefore, the Cu residues 400 in FIG. 2 need to be completely removed.

Figure 3:
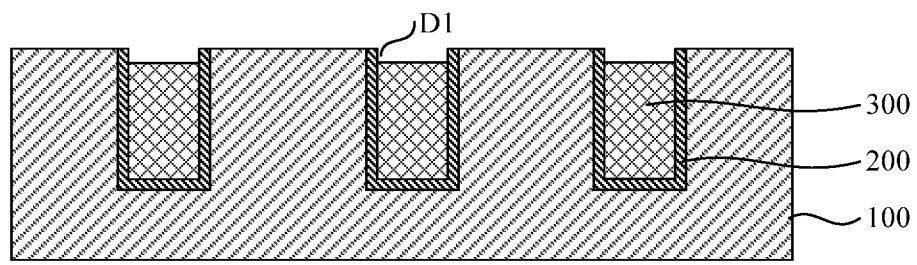
FIG. 3 is a schematic structural diagram after a wet etch process of Cu according to an embodiment.

Then, referring to FIG. 3, a wet etch process is performed to remove the Cu residues 400 and a part of the Cu post 300, so as to form a first height difference D1 between the Cu post 300 and the insulating layer 200.

As an example, an etchant solution used during the wet etch process includes an acid solution for a chemical reaction with Cu, and the acid solution includes one or more of an $H_2O_2$ solution, an $H_3PO_4$ solution, and an $H_2SO_4$ solution.

Specifically, by means of wet processing of the acid solution, the Cu residues 400 on an edge of the Cu post 300 may be effectively removed. Further, the acid solution may also remove a top part from the Cu post 300, so that the first height difference D1 is formed between the Cu post 300 and the top surface of the insulating layer 200, thereby further preventing the Cu residues 400 that are not completely removed from contacting the Cu post 300, so as to enhance the electrical properties of the device that is subsequently prepared.

As an example, the first height difference D1 is in a range of 0.1 μm to 0.5 μm.

Specifically, a larger value of the first height difference D1 facilitates prevention of the Cu residues 400 from contacting the Cu post 300. However, an excessively large first height difference D1 may cause the insulating layer 200 to generate defects such as cracks in the subsequent polishing process, which risks electrical conduction between the Cu post 300 and the Si substrate 100. Therefore, in an embodiment, the first height difference D1 is preferably set at about 0.3 μm, but the present disclosure is not limited thereto. For example, the first height difference may also be 0.2 μm, 0.4 μm, or the like.

Figure 4:
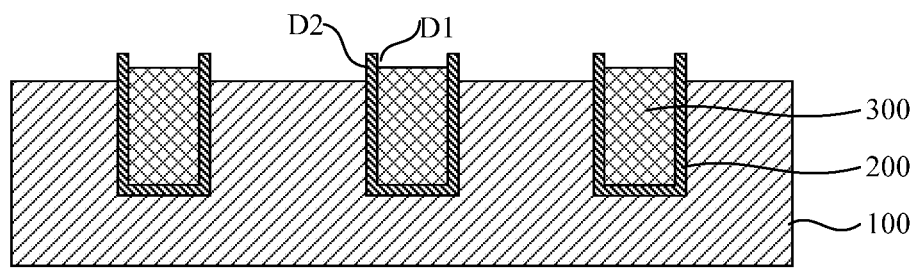
FIG. 4 is a schematic structural diagram after dry etching the Si substrate according to an embodiment.

Then, referring to FIG. 4, the Si substrate 100 is dry etched to form a second height difference D2 between the top surfaces of the Si substrate 100 and the insulating layer 200, and the second height difference D2 is arranged to be greater than the first height difference D1.

Specifically, by means of dry etching, the second height difference D2 may be formed between the Si substrate 100 and the insulating layer 200, and the second height difference D2 is arranged to be greater than the first height difference D1. In this way, connections of Cu materials inside and outside the insulating layer 200 may be further avoided, thereby effectively avoiding negative impact on electrical properties of the device.

As an example, the second height difference D2 is in the range of 2 μm to 5 μm.

Specifically, a larger value of the second height difference D2 facilitates a larger barrier for the Cu residues 400 to contact the Cu post 300. However, an excessively large second height difference D2 may weaken the insulating layer 200 so defects such as cracks may generate in the subsequent polishing process, which risks electrical conduction between the Cu post 300 and the Si substrate 100 instead. Therefore, in this embodiment, the second height difference D2 is preferably set at about 3 μm, but the present disclosure is not limited thereto, and the second height difference D2 may also be, for example, near 2 μm, 4 μm, or the like.

Referring to FIG. 4 the first and the second height differences are shown in the semiconductor structure. The semiconductor structure may be prepared by using the foregoing method, but the present disclosure is not limited thereto.

Specifically, the semiconductor structure includes a Si substrate 100, an insulating layer 200, and a Cu post 300. The Cu post 300 is located in the Si substrate 100, the insulating layer 200 covers side walls and a bottom surface of the Cu post 300 and is in contact with the Si substrate 100, the structure comprises a first height difference D1 between the Cu post 300 and the insulating layer 200 and a second height difference D2 between the Si substrate 100 and the insulating layer 200, herein the second height difference D2 is configured to be greater than the first height difference D1.

In the semiconductor structure, the first height difference D1 between the Cu post 300 and the insulating layer 200 may effectively avoid negative impact on the electrical properties of the device. Further, since the second height difference D2 is formed between the Si substrate 100 and the insulating layer 200, and the second height difference D2 is greater than the first height difference D1, connections of Cu materials inside and outside the insulating layer 200 may be further avoided, thereby setting an effective battier to protect the electrical properties of the device.

As an example, the first height difference D1 is in a range of 0.1 μm to 0.5 μm.

Specifically, a larger value of the first height difference D1 facilitates prevention of the Cu residues from contacting the Cu post 300. However, an excessively large first height difference D1 may weaken the insulating layer 200 such that defects like crack may generate in the subsequent polishing process, which risks electrical conduction between the Cu post 300 and the Si substrate 100. Therefore, in an embodiment, the first height difference D1 is preferably set at about 0.3 μm, but the present disclosure is not limited thereto, which may also be, for example, 0.2 μm, 0.4 μm, or the like.

As an example, the second height difference D2 is in a range of 2 μm to 5 μm.

Specifically, a larger value of the second height difference D2 facilitates a larger barrier of the Cu residues from contacting the Cu post 300. However, an excessively large second height difference D2 may further weaken the insulating layer 200 defects such as cracks can be generated in the subsequent polishing process, which risks electrical conduction between the Cu post 300 and the Si substrate 100. Therefore, in an embodiment, the second height difference D2 is preferably set at about 3 μm, but the present disclosure is not limited thereto, and the second height difference may also be, for example, about 2 μm, 4 μm, or the like.

As an example, a metal seed layer (not shown in the figures) is further formed between the insulating layer 200 and the Cu post 300, and the metal seed layer has the same height as the Cu post 300.

Specifically, the metal seed layer may include a Ti/Cu seed layer or a Cu seed layer, but the present disclosure is not limited thereto, which may be specifically selected as required. Preferably, the metal seed layer adopts the Cu seed layer, and the Cu seed layer is etched to the same height as the Cu post 300, so as to prevent the metal seed layer from connecting to Cu residues outside the insulating layer 200.

As an example, the insulating layer 200 includes one or more of a $SiO_2$ layer and a $Si_3N_4$ layer.

Specifically, the insulating layer 200 may effectively prevent a conductive channel from being built between the Cu post 300 and the Si substrate 100, thereby achieving a desirable insulation effect. The specific formation method, thickness, and material of the insulating layer 200 may be selected as required, and are not limited herein. In an embodiment, the insulating layer 200 is a $SiO_2$ layer, but the present disclosure is not limited thereto. The insulating layer 200 may also adopt the $Si_3N_4$ layer or stacked layers comprising a $SiO_2$ layer and $Si_3N_4$ layer.

Based on the above, according to the semiconductor structure and the method for preparing the same of the present disclosure, after planarization of the Cu layer, by means of wet etch process, Cu residues near an edge of a Cu post can be effectively removed, and a first height difference is configured to be between the Cu post and an insulating layer. Further, the Si substrate is dry etched, so that a second height difference is configured to be between the Si substrate and the insulating layer, and the second height difference is greater than the first height difference. In this way, leakage of Cu materials inside and outside the insulating layer may be further avoided, thereby effectively avoiding detrimental impact on electrical properties of the device.

The foregoing embodiments merely exemplify the principles and effects of the present disclosure, but are not intended to limit the present disclosure. Any person skilled in the art may make modifications or changes on the foregoing embodiments without departing from the spirit and scope of the present disclosure. Therefore, any equivalent modifications or changes completed by a person of ordinary skill in the art without departing from the spirit and technical concept disclosed in the present disclosure should fall within the scope of the claims of the present disclosure.

What is claimed is:

1. A method for preparing a semiconductor structure, comprising following steps: providing a Si substrate; patterning a groove in the Si substrate; forming an insulating layer in the groove to cover an entire bottom surface and side walls of the groove; forming a Cu layer and filling the groove with a Cu post, wherein the insulating layer covers side walls and a bottom surface of the Cu post and is in contact with the Si substrate; performing planarization on the Cu layer to expose the Si substrate, the insulating layer, and the Cu post; performing a wet etch process to remove Cu residues and a part of the Cu post, wherein a first height difference is configured to be between a top surface of the Cu post and a top surface of the insulating layer; and dry etching the Si substrate, wherein a second height difference is configured to be between a top surface of the Si substrate and the top surface of the insulating layer, and wherein the second height difference is configured to be greater than the first height difference, wherein the first height difference is in a range of 0.1 µm to 0.5 µm, and wherein the second height difference is in a range of 2 µm to 3 µm.

2. The method for preparing the semiconductor structure according to claim 1, wherein an etchant solution used during the wet etch process comprises an acid solution for a chemical reaction with Cu, and wherein the acid solution comprises one or more of an $H_2O_2$ solution, an $H_3PO_4$ solution, and an $H_2SO_4$ solution.

3. The method for preparing the semiconductor structure according to claim 1, wherein the first height difference is in a range of 0.1 µm to 0.5 µm, and wherein the second height difference is in a range of 2 µm to 5 µm.

4. The method for preparing the semiconductor structure according to claim 1, wherein the planarization comprises one or more of mechanical polishing and chemical mechanical polishing.

5. The method for preparing the semiconductor structure according to claim 1, wherein after the forming the insulating layer and before the forming the Cu post, the method further comprises a step of forming a metal seed layer.

6. A semiconductor structure, comprising: a Si substrate having a groove, an insulating layer disposed in the groove at side walls and a bottom surface of the groove, wherein the insulating layer covers side walls and an entire bottom surface of the groove, and a Cu post disposed on the insulating layer in the groove followed by a wet etch process removing Cu residues and a part of the Cu post; wherein a first height difference is arranged between a top surface of the Cu post and a top surface of the insulating layer, wherein a second height difference is arranged between a top surface of the Si substrate and the top surface of the insulating layer, and wherein the second height difference is greater than the first height difference, and wherein the first height difference is in a range of 0.1 µm to 0.5 µm, and the second height difference is in a range of 2 µm to 3 µm.

7. The semiconductor structure according to claim 6, wherein the first height difference is in a range of 0.1 µm to 0.5 µm.

8. The semiconductor structure according to claim 6, wherein the second height difference is in a range of 2 µm to 5 µm.

9. The semiconductor structure according to claim 6, wherein a metal seed layer is further formed between the insulating layer and the Cu post, and the metal seed layer has the same height as the Cu post.

10. The semiconductor structure according to claim 6, wherein the insulating layer comprises one or more of a $SiO_2$ layer and a $Si_3N_4$ layer.

* * * * *